United States Patent
Chien (10) Patent No.: US 10,884,306 B2
(45) Date of Patent: Jan. 5, 2021

(54) METHOD FOR MANUFACTURING ARRAY SUBSTRATE AND DISPLAY DEVICE

(71) Applicants: HKC CORPORATION LIMITED, Shenzhen (CN); Chongqing HKC Optoelectronics Technology Co., Ltd., Chongqing (CN)

(72) Inventor: Chung-Kuang Chien, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/334,356

(22) PCT Filed: Oct. 16, 2017

(86) PCT No.: PCT/CN2017/106312
§ 371 (c)(1),
(2) Date: Mar. 19, 2019

(87) PCT Pub. No.: WO2019/000709
PCT Pub. Date: Jan. 3, 2019

(65) Prior Publication Data
US 2019/0212595 A1 Jul. 11, 2019

(30) Foreign Application Priority Data
Jun. 29, 2017 (CN) .......................... 2017 1 0514936

(51) Int. Cl.
*G02F 1/1368* (2006.01)
*H01L 27/12* (2006.01)
(Continued)

(52) U.S. Cl.
CPC .......... *G02F 1/1368* (2013.01); *G02F 1/1362* (2013.01); *G02F 1/133516* (2013.01);
(Continued)

(58) Field of Classification Search
CPC ............. G02F 1/1368; G02F 1/133516; G02F 1/1362; G02F 2001/136222;
(Continued)

(56) References Cited

U.S. PATENT DOCUMENTS 6,218,310 B1 * 4/2001 Shen .................. H01L 21/28123
257/E21.206
2004/0185382 A1 * 9/2004 Byun ........................ G03F 7/40
430/313
(Continued)

FOREIGN PATENT DOCUMENTS

CN 102455593 A 5/2012
CN 102543712 A 7/2012
(Continued)

OTHER PUBLICATIONS

Ruoge Bai, the ISA written comments, dated Mar. 2018, CN.
Ruoge Bai, the International Search Report, dated Mar. 2018. CN.

*Primary Examiner* — Charles S Chang (57) ABSTRACT

The present disclosure provides a method for manufacturing an array substrate and a display device. The method for manufacturing the array substrate includes providing a substrate; disposing a metal layer material on the substrate; disposing thermal reactive photoresist material on the metal layer material; obtaining a thermal reactive photoresist layer using a mask process and a thermal reaction process; and obtaining a metal layer by an etching process.

15 Claims, 5 Drawing Sheets

(51) Int. Cl.
*G02F 1/1335* (2006.01)
*G02F 1/1362* (2006.01)

(52) U.S. Cl.
CPC ...... *H01L 27/1214* (2013.01); *H01L 27/1259* (2013.01); *G02F 2001/13625* (2013.01); *G02F 2001/136222* (2013.01)

(58) Field of Classification Search
CPC ....... G02F 2001/13625; H01L 27/1259; H01L 27/1214
USPC .......................................................... 349/187
See application file for complete search history.

(56) References Cited

U.S. PATENT DOCUMENTS

2005/0074705 A1* 4/2005 Toyoda ................ H05K 3/0079
430/323
2018/0226269 A1* 8/2018 Feng ..................... G03F 7/0035

FOREIGN PATENT DOCUMENTS

| CN | 106842685 A | 6/2017 |
| JP | 2000004021 A | 1/2000 |
| JP | 2002110628 A | 4/2002 |

* cited by examiner

METHOD FOR MANUFACTURING ARRAY SUBSTRATE AND DISPLAY DEVICE

TECHNICAL FIELD

The present disclosure relates to a field of display technology, and in particular to a method for manufacturing an array substrate and a display device.

BACKGROUND

A display apparatus has advantages, such as a thin body, saving-power, no radiation, and is widely used. A conventional display apparatus is mostly a backlight display apparatus. Operating principle of the display apparatus is that liquid crystal (LC) molecules are disposed between two substrates, where the two substrates are parallelly disposed, and a driving voltage applied on the two substrates controls rotation direction of the LC molecules, so that light of a backlight module are refracted to generate images.

A thin film transistor-liquid crystal display (TFT-LCD) has some performances, such as low power consumption, excellent image quality, and high production yield, which has gradually occupied main position of a display field. The TFT-LCD includes a display panel and the backlight module, where the display panel includes a color filter (CF) substrate, a TFT substrate and a mask. A transparent electrode is disposed on inner side of the two substrates and the LC layer is disposed between the two substrates. The display panel controls orientation of the liquid crystal molecules by an electric field, changes a polarization state of the light, and achieves display by penetration and blocking of a light path by a polarized plate.

At present, liquid crystal display (LCD) products tend to have higher and higher resolution, and a manufacturing technology of a mask limits its precision and hinders development of liquid crystal display products to a higher resolution.

SUMMARY

The technical problem to be solved by the present disclosure is to provide a method for manufacturing an array substrate that effectively improves a resolution of a display panel.

The purpose of the present disclosure is achieved by the following technical solutions:

A method for manufacturing an array substrate comprises providing a substrate;
disposing a metal layer material on the substrate;
disposing thermal reactive photoresist material on the metal layer material;
obtaining a thermal reactive photoresist layer using a mask process and a thermal reaction process; and
obtaining a metal layer by an etching process.

Furthermore, the step for obtaining the thermal reactive photoresist layer using the mask process and the thermal reaction process comprises:
obtaining a pattern of the metal layer on the thermal reactive photoresist material using the mask process and a heating reaction process; and
obtaining the thermal reactive photoresist layer by a developing process.

The thermal reactive photoresist material is exposed and developed by the heating reaction process acted on the thermal reactive photoresist material. The heating reaction process further reduces widths of the wire segments of the metal layer, therefore the required pattern of the metal layer is obtained. And then the metal layer material is etched by an etching solution, therefore, the metal layer is obtained conveniently and simply.

Furthermore, the step for obtaining a metal layer by an etching process comprises:
removing residual thermal reactive photoresist layer.

When the metal layer required is obtained, the residual thermal reactive photoresist layer on the metal layer is removed by a cleaning solution to facilitate a subsequent process of the array substrate.

Furthermore, the step for obtaining the pattern of the metal layer on the thermal reactive photoresist material using the mask process and the heating reaction process comprises:
obtaining a preliminary pattern of the metal layer on the thermal reactive photoresist material using the mask process; and
obtaining the pattern of the metal layer on a basis of the preliminary pattern by the heating reaction process.

In this way, using the mask process facilitates a precise control of the subsequent heating reaction, thus, the pattern of the metal layer obtained by the heating reaction is more ideal, and a mutual influence of the mask process and the heating reaction process is effectively avoided. The precise control of the subsequent heating reaction is facilitated, which effectively avoid defects of the metal layer, ensures a yield of the array substrate, better saves a production cost, and more effectively improves a market competitiveness of the display panel.

Furthermore, the step for obtaining the pattern of the metal layer on a basis of the preliminary pattern by the heating reaction process comprises:
obtaining predetermined reaction data of the thermal reactive photoresist material according to a gap requirement of the metal layer of the array substrate; and
obtaining the pattern of the metal layer by acting on the thermal reactive photoresist material according to the predetermined reaction data.

Furthermore, the predetermined reaction data comprises a predetermined temperature and a predetermined time. In this way, the predetermined temperature and the predetermined time required for the thermal reactive photoresist material are calculated through the gap requirement of the metal layer. The gap between the thermal reactive photoresist materials is controlled accurately by precisely controlling the heating temperature and the reaction time of the thermal reactive photoresist material. The thermal reactive photoresist material 3 is functioned according to the predetermined temperature and the predetermined time, thus, the pattern of the metal layer required is obtained very well, which better meets design requirements of the array substrate, further improves a manufacturing precision of the array substrate, ensures the display effect of the display panel, better realizes requirements of research and development. Further, the display panel products with higher resolution and higher definition are produced, which better meets needs of users.

Furthermore, an active switch is disposed on the substrate, and the metal layer comprises a grid layer of the active switch.

The thermal reactive photoresist material is exposed and developed by the mask process and the heating reaction process acted on the thermal reactive photoresist material, and the heating reaction further reduces widths of the wire segments of the grid layer, therefore, a required pattern of the grid layer is obtained. And then, the grid layer is etched by the etching solution. Thus, the grid layer is obtained conveniently and simply.

Furthermore, the metal layer comprises a source layer of the active switch and a drain layer of the active switch. The source layer and the drain layer formed by the method is capable of saving space of the active switch, making more active switches and more pixel units to be set within per unit area, effectively improving the resolution of the display panel, further improving the display effect of the display panel, making the display effect of the display panel clearer and more natural, better improving a display quality of the display panel, and effectively raising the market competitiveness of the display panel.

Furthermore, the source layer is connected with a driving electrode; the drain layer is connected with a pixel electrode; the metal layer comprises the driving electrode and the pixel electrode. The thermal reactive photoresist material exposed and developed by the mask process and the heating reaction process acted on the thermal reactive photoresist material. The heating reaction further reduces the widths of the wire segments of the driving electrode and the pixel electrode, therefore, required patterns of the driving electrode and the pixel electrode are obtained. And then, the driving electrode and the pixel electrode are etched by the etching solution, therefore, the driving electrode and the pixel electrode are obtained conveniently and simply.

According to another aspect of the present disclosure, the present disclosure further provides a display device. The display device comprises:
a drive circuit; and
a display panel.

The display panel comprises the array substrate manufactured by the method. The array substrate produced by the method is used to form a display panel using the prepared array substrates, which effectively improves the resolution of the display panel, further improves the display effect of the display panel, makes the display effect of the display panel clearer and more natural, better improves the display quality of the display panel, and effectively raises the market competitiveness of the display panel. Firstly, the metal layer material to be subjected by a photo engraving process is disposed on the substrate, then the thermal reactive photoresist material is disposed of the metal layer material, and the mask process and the heating reaction process are acted on the thermal reactive photoresist material. Since the thermal reactive photoresist material further reacts during the heating reaction, wire segments of the metal layer are effectively reduced in width. The gap between the wire segments is increasing, which makes the setting of pixel units more convenient, and makes more pixel units to be set within per unit area. Thus, the resolution of the display panel is effectively improved, the display quality of the display panel is better improved, and the market competitiveness of the display panel is effectively raised.

DETAILED DESCRIPTION

Specific structure and function details disclosed herein are only representative and are used for the purpose of describing exemplary embodiments of the present disclosure. However, the present disclosure may be achieved in many alternative forms and shall not be interpreted to be only limited to the embodiments described herein.

It should be understood in the description of the present disclosure that terms such as "central", "horizontal", "upper", "lower", "right", "vertical", "horizontal", "top", "bottom", "inner", "outer", etc. indicate direction or position relationships shown based on the drawings, and are only intended to facilitate the description of the present disclosure and the simplification of the description rather than to indicate or imply that the indicated device or element mast have a specific direction or constructed and operated in a specific direction, and therefore, shall not be understood as a limitation to the present disclosure. In addition, the terms such as "first" and "second" are only used for the purpose of description, rather than being understood to indicate or imply relative importance or hint the number of indicated technical features. Thus, the feature limited by "first" and "second" can explicitly or impliedly comprise one or more features. In the description of the present disclosure, the meaning of "a plurality of" is two or more unless otherwise specified. In addition, the term "comprise" and any variant are intended to cover non-exclusive inclusion.

It should be noted in the description of the present disclosure that, unless otherwise regulated and defined, terms such as "installation," "bonded," and "bonding" shall be understood in broad sense, and for example, may refer to fixed bonding or detachable bonding or integral bonding; may refer to mechanical bonding or electrical bonding; and may refer to direct bonding or indirect bonding through an intermediate medium or inner communication of two elements. For those of ordinary skill in the art, the meanings of the above terms in the present disclosure may be understood according to concrete conditions.

The terms used herein are intended to merely describe concrete embodiments, not to limit the exemplary embodiments. Unless otherwise noted clearly in the context, singular forms "one" and "single" used herein are also intended to comprise plurals. It should also be understood that the terms "comprise" and/or "include" used herein specify the existence of stated features, integers, steps, operation, units and/or assemblies, not excluding the existence or addition of one or more other features, integers, steps, operation, units, assemblies and/or combinations of these.

The present disclosure will he further described in detail below in combination with the drawings and embodiments.

Figure 1:
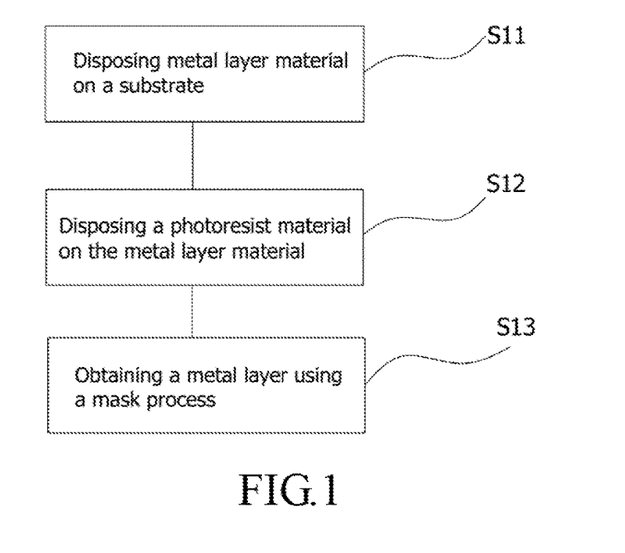
FIG. 1 is a flow diagram of a method for manufacturing an array substrate according to an example of an embodiment of the present disclosure.

As shown on FIG. 1, the present disclosure provides an example of an embodiment of a method for manufacturing an array substrate. The method for manufacturing the array substrate comprises:

S11: disposing metal layer material on a substrate;

S12: disposing a photoresist material on the metal layer material; and

S13: obtaining a metal layer using a mask process.

With this method, the metal layer of the array substrate can be well fabricated, and the photoresist material 4 is exposed and developed by the mask process to obtain a pattern of the metal layer same as a pattern of a mask 5. Due to a technology is mature in the prior art, the array substrate is well controlled and produced, which effectively controls and reduces production costs.

Figure 2:
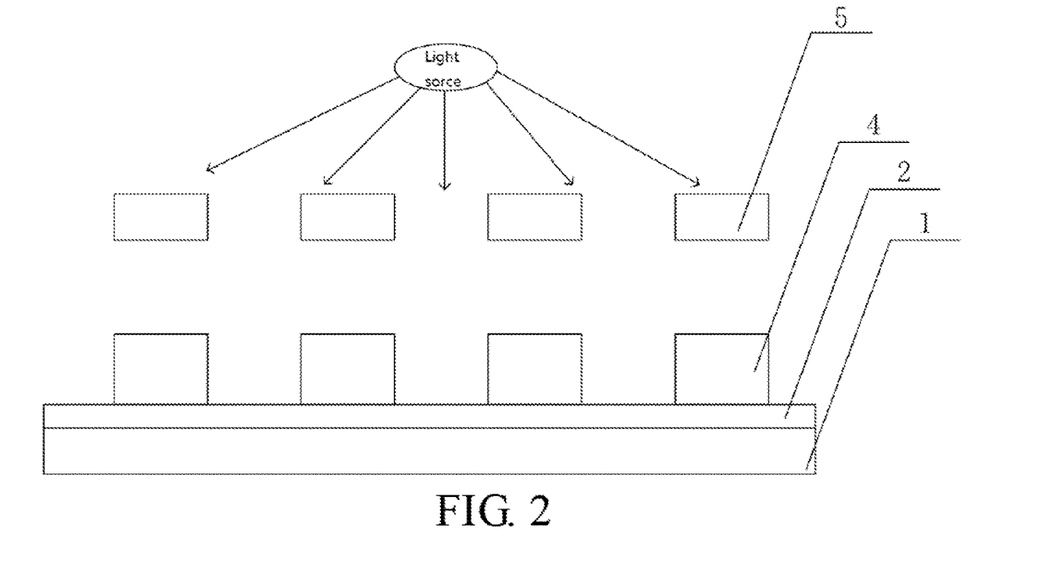
FIG. 2 is a schematic diagram of the method for manufacturing the array substrate according to an example of an embodiment of the present disclosure.

As shown in FIG. 2, which is a schematic diagram of an example of the method for manufacturing the array substrate. A metal layer material 2 is disposed on the substrate 1, and then, the photoresist material 4 is disposed on the metal layer material 2, and the photoresist material 4 is exposed through the mask process. Thus, the pattern of the metal layer same as the pattern of the mask 5 is obtained, ensuring that the metal layer is able to work effectively.

Further research has found that due to a limitation of the manufacturing technology of the mask 5, the precision of the mask 5 is limited, and it is impossible to reduce a gap between wires formed by the metal layer, which hinders a development of the product to a higher resolution. Therefore, a new technical solution is provided to effectively improve the resolution of the display panel.

Figure 3:
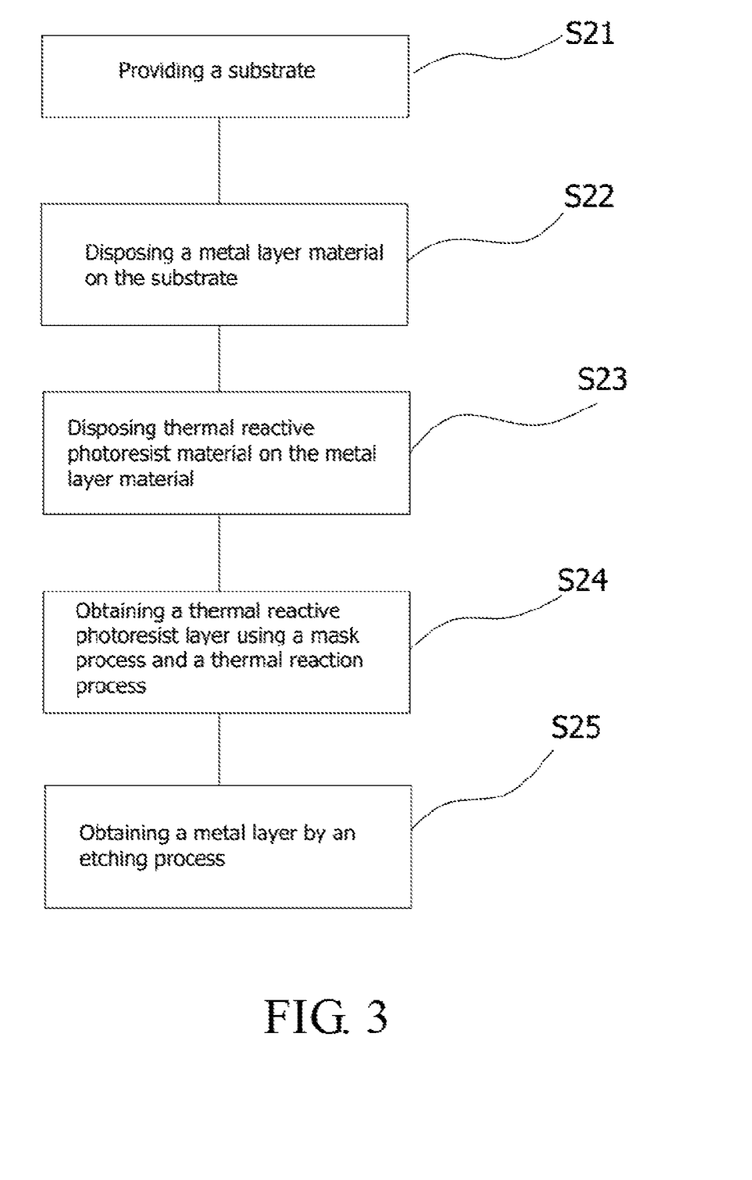
FIG. 3 is a flow diagram of the method for manufacturing the array substrate according to an embodiment of the present disclosure.

As shown in FIG. 3, which is a flow diagram of the method for manufacturing the array substrate. The array substrate comprises a substrate 1, and the manufacturing method comprises following steps:

S21: providing a substrate;

S22: disposing a metal layer material on the substrate;

S23: disposing thermal reactive photoresist material on the metal layer material;

S24: obtaining a thermal reactive photoresist layer using a mask process and a thermal reaction process; and S25: obtaining a metal layer by air etching process.

The array substrate produced by the method is used to form a display panel using the prepared array substrates, which effectively improves the resolution of the display panel, further improves a display effect of the display panel, makes a display effect of the display panel clearer and more natural, better improves a display quality of the display panel, and effectively raises a market competitiveness of the display panel. Firstly, the metal layer material 2 to be subjected by a photo engraving process is disposed on the substrate 1, then the thermal reactive photoresist material 3 is disposed on the metal layer material 2, and a mask process and a heating reaction process are acted on the thermal reactive photoresist material 3. Since the thermal reactive photoresist material 3 further reacts during the heating reaction, wire segments of the metal layer are effectively reduced in width. The gap between the wire segments is increasing, which makes a setting of pixel units more convenient, and makes more pixel units to be set within per unit area. Thus, the resolution of the display panel is effectively improved, the display quality of the display panel is better improved, and the market competitiveness of the display panel is effectively raised.

Figure 4:
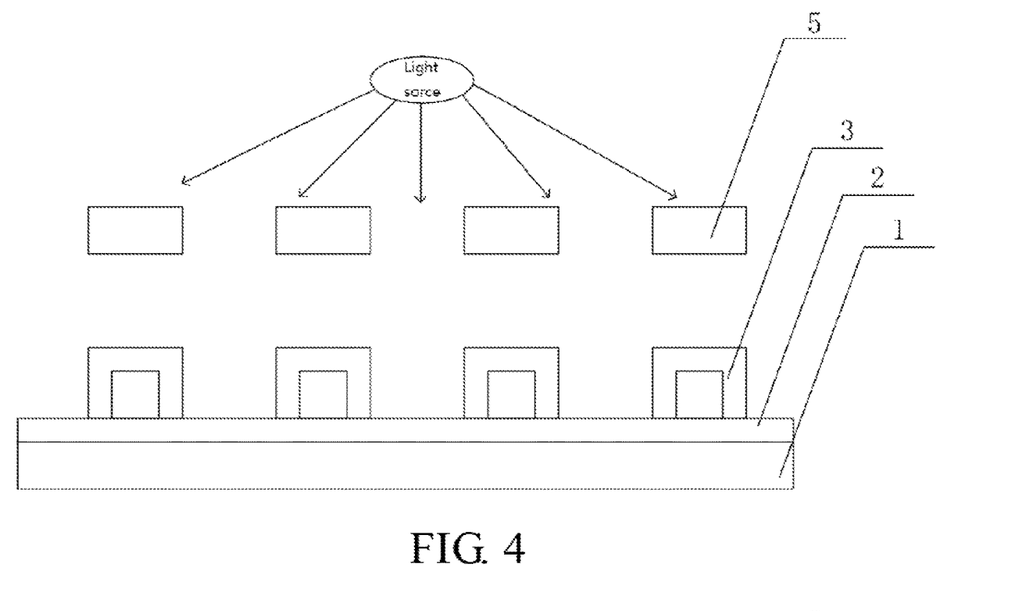
FIG. 4 is a schematic diagram of the method for manufacturing the array substrate according to an embodiment of the present disclosure.

As shown in FIG. 4, which is a flow diagram of the method for manufacturing the array substrate. The metal layer material 2 is disposed on the substrate 1, then the thermal reactive photoresist material 3 is disposed on the metal layer material 2. The thermal reactive photoresist material 3 is exposed and developed by the mask process and the thermal reactive photoresist material 3 is reacted by a heating action process, which makes the wire segment of the metal layer smaller than the grating line of the mask 5 in width, saves space on the array substrate, further improves the utilization of panel space, and makes more pixel units to be set within per unit area. Thus, the display effect of the display panel is improved, the resolution of the display panel is further improved, and the display quality of the display panel is better improved.

Figure 5:
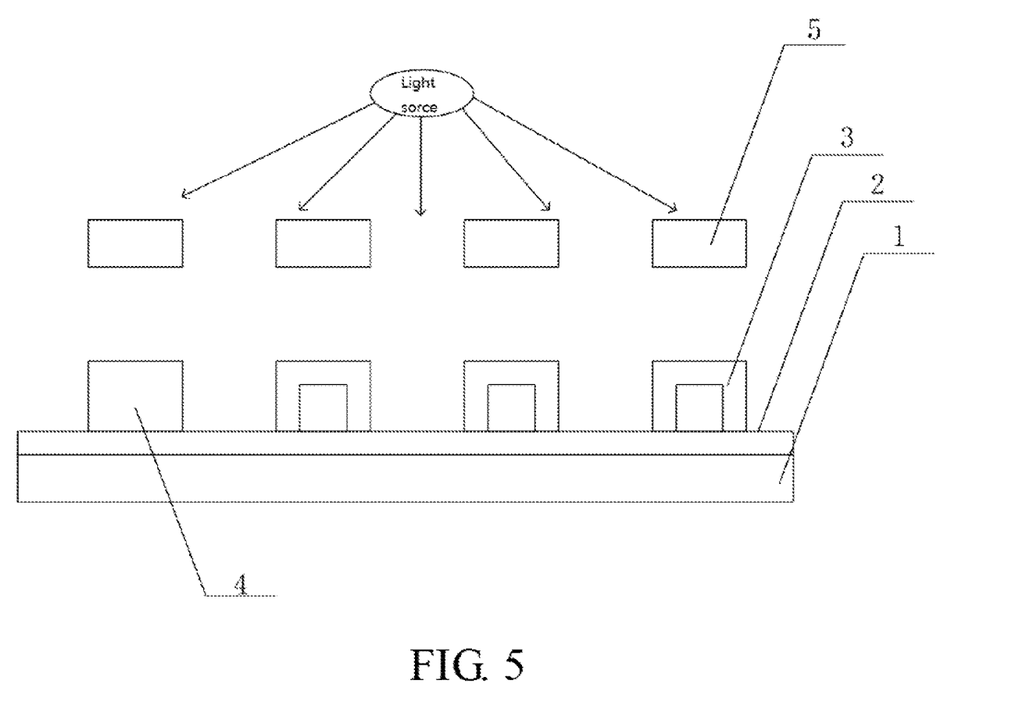
FIG. 5 is a schematic diagram of the method for manufacturing the array substrate according to an embodiment of the present disclosure.

AS shown in FIG. 5, the thermal reactive photoresist material 3 and the ordinary photoresist material 4 can be mixed to use. The thermal reactive photoresist material 3 is disposed at a position where thinner wire segments are required, and the ordinary photoresist material 4 is disposed at a position where normal etching is required, which effectively improves the display effect of the display panel, further improves the resolution of the display panel, effectively saves production costs, and effectively raises the market competitiveness of the display panel.

Figure 6:
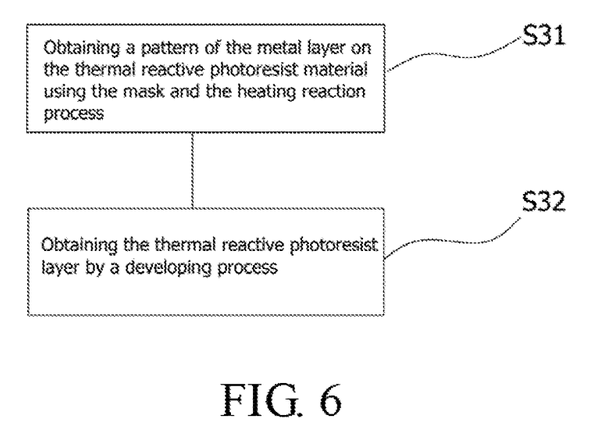
FIG. 6 is a flow diagram of the method for manufacturing the array substrate according to an embodiment of the present disclosure.

As shown in FIG. 6, the step for obtaining the thermal reactive photoresist layer using the mask and the thermal reaction process comprises:

S31: obtaining a pattern of the metal layer on the thermal reactive photoresist material using the mask and the heating reaction process; and S32: obtaining the thermal reactive photoresist layer by a developing process.

The thermal reactive photoresist material 3 is exposed and developed by the mask process and the heating reaction process acted on the thermal reactive photoresist material 3. The heating reaction process further reduces widths of the wire segments of the metal layer, therefore the required pattern of the metal layer is obtained. And then the metal layer material 2 is etched by an etching solution, therefore, the metal layer is obtained conveniently and simply. And then, other processes are performed on the metal layer to form the array substrate. The heating reaction of the thermal reactive photoresist material 3 reduces the widths of the wire segments of the metal layer, which better saves space on the array substrate, further improves the utilization of the panel space, and makes more pixel units to be set within per unit area. It's certainly that the thermal reactive photoresist material 3 and the ordinary photoresist material 4 can be mixed to use. The thermal reactive photoresist material 3 is disposed at a position of the wire segments of the metal layer, and the ordinary photoresist material 4 is disposed at a position of the non-wire segment of the metal layer, which effectively saves the thermal reactive photoresist material 3, effectively saves production costs of the array substrate, effectively raises the market competitiveness of the display panel, improves a display effect of the display panel, and further improves the resolution of the display panel.

To be specific, the step for obtaining the metal layer by the etching process comprises: removing residual thermal reactive photoresist layer. When the metal layer required is obtained, the residual thermal reactive photoresist layer on the metal layer is removed by a cleaning solution to facilitate a subsequent process of the array substrate.

Figure 7:
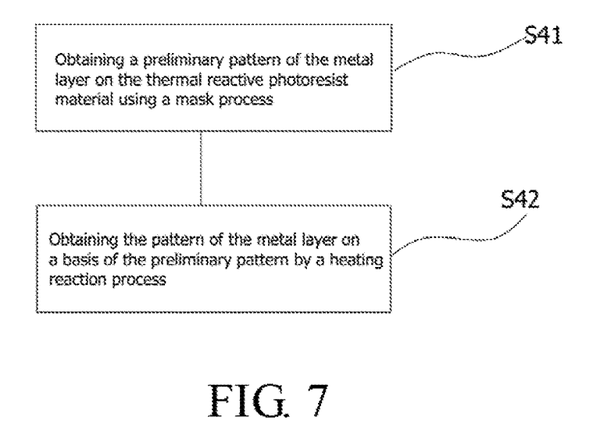
FIG. 7 is a flow diagram of the method for manufacturing the array substrate according to an embodiment of the present disclosure.

As shown in FIG. 7, the step for obtaining a pattern of the metal layer on the thermal reactive photoresist material using the mask process and a heating reaction process comprises;

S41: obtaining a preliminary pattern of the metal layer on the thermal reactive photoresist material using a mask process; and S42: obtaining the pattern of the metal layer on a basis of the preliminary pattern by a heating reaction process.

Firstly, the thermal reactive photoresist material 3 is subjected to the mask process to obtain the preliminary pattern of the metal layer, and the shape of the preliminary pattern is same as the shape of the mask 5, which facilitates a subsequent heating reaction operation. By acting the heating reaction on the thermal reactive photoresist material 3, a more desirable pattern of the metal layer is obtained, and the wire segment of the metal layer is smaller than the grating line of the mask 5 in width, which better saves space on the array substrate, further improves the utilization of the panel space, makes more pixel units to be set within per unit area, further improves the resolution of the display panel, and further improves the display effect of the display panel.

Figure 8:
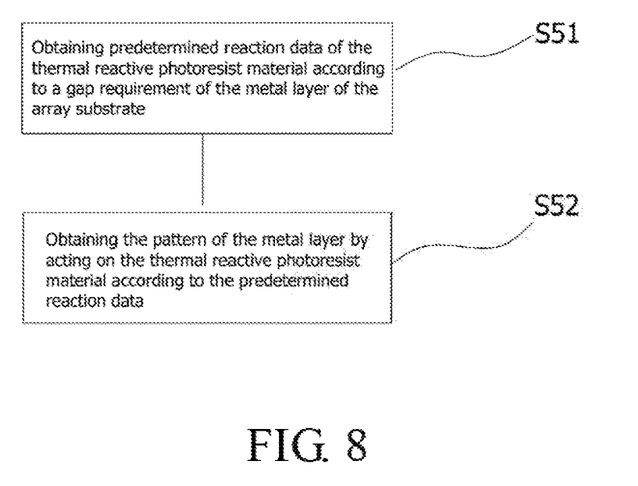
FIG. 8 is a flow diagram of the method for manufacturing the array substrate according to an embodiment of the present disclosure.

As shown in FIG. 8, the step for obtaining the pattern of the metal layer on a basis of the preliminary pattern by a heating reaction process comprises:

S51: obtaining predetermined reaction data of the thermal reactive photoresist material according to a gap requirement of the metal layer of the array substrate; and S52: obtaining the pattern of the metal layer by acting on the thermal reactive photoresist material according to the predetermined reaction data.

The predetermined reaction data required for the thermal reactive photoresist material 3 are calculated through the gap requirement of the metal layer. The predetermined reaction data comprises the predetermined temperature and the predetermined time. The gap between the thermal reactive photoresist materials 3 is controlled accurately by precisely controlling the heating temperature and the reaction time of the thermal reactive photoresist material 3, therefore, the gap of the metal layer required is obtained. The thermal reactive photoresist material 3 is functioned according to the predetermined temperature and the predetermined time, so that the superduper pattern of the metal layer required is obtained, which better meets design requirements of the array substrate, further improves a manufacturing precision of the array substrate, ensures the display effect of the display panel, better realizes requirements of research and development.

Figure 9:
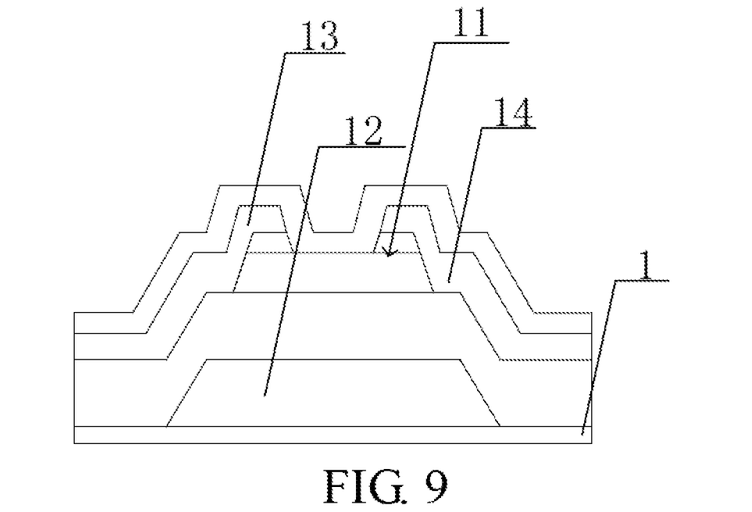
FIG. 9 is a schematic diagram of a cross-sectional structural of the array substrate according to an embodiment of the present application.
Figure 10:
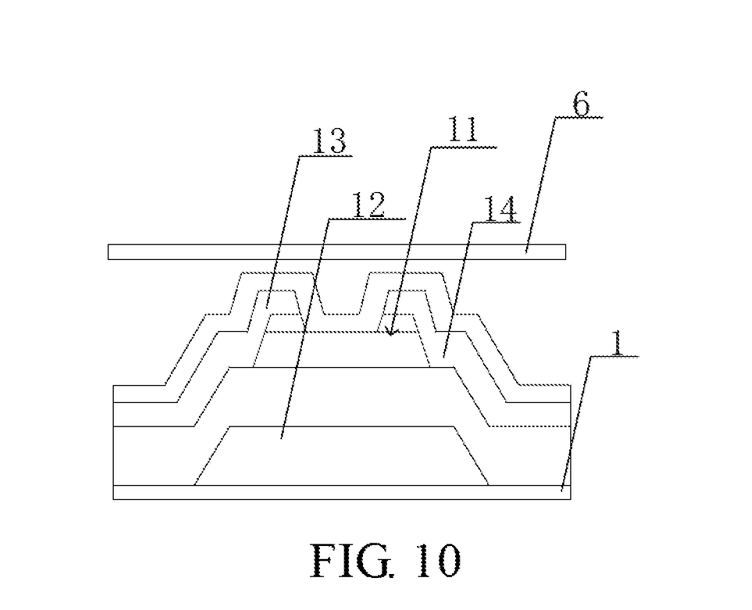
FIG. 10 is a schematic diagram of a cross-sectional structural of the array substrate according to an embodiment of the present application.

As shown in FIG. 5 and FIG. 9, an active switch 11 is disposed on the substrate 1, and the metal layer comprises a grid layer 12 of the active switch 11. The thermal reactive photoresist material 3 is exposed and developed by the mask process and the heating reaction process acted on the thermal reactive photoresist material 3, and the heating reaction further reduces widths of the wire segments of the grid layer 12, therefore the required pattern of the grid layer 12 is obtained. And then the grid layer 12 is etched by the etching solution, therefore, the grid layer 12 is obtained conveniently and simply. And then, other processes are performed on the grid layer 12 to form the array substrate. The heating reaction of the thermal reactive photoresist material 3 reduces the widths of the wire segments of the grid layer 12, which better saves space on the array substrate, further improves the utilization of the panel space, and makes more pixel units to be set within per unit area. It's certainly that the thermal reactive photoresist material 3 and the ordinary photoresist material 4 can be mixed to use. The thermal reactive photoresist material 3 is disposed at a position of the wire segments of the grid layer 12, and the ordinary photoresist material 4 is disposed at a position of the non-wire segment, which effectively saves the thermal reactive photoresist material 3, effectively raises the market competitiveness of the display panel, effectively saves production costs of the array substrate, improves the display effect of the display panel, and further, improves the resolution of the display panel. It's certainly that the thermal reactive photoresist material 3 and the ordinary photoresist material 4 can be mixed to use. The thermal reactive photoresist material 3 is disposed at the position where thinner wire segments are required, and the ordinary photoresist material 4 is disposed at the position where normal etching is required, which effectively improves the display effect of the display panel, and further improves the resolution of the display panel, effectively saves production costs, and effectively raises the market competitiveness of the display panel.

To be specific, the metal layer comprises a source layer 13 of the active switch 11 and a drain layer 14 of the active switch 11, which saves space of the active switch 11, makes more active switches 11 and more pixel units to be set within per unit area, effectively improves the resolution of the display panel, further improves the display effect of the display panel, makes the display effect of the display panel clearer and more natural, better improves a display quality of the display panel, and effectively improves the market competitiveness of the display panel. To arrange the thermal reactive photoresist material 3 on the source layer 13 and the drain layer 14, and a mask process and a heating reaction process are acted on the thermal reactive photoresist material 3, since the thermal reactive photoresist material 3 further reacts during the heating reaction, widths of wire segments of the source layer 13 and the drain layer 14 are effectively reduced, the gap between the wire segments is increasing, which makes the setting of the pixel units more convenient, makes more pixel units to be set within per unit area, effectively improves the resolution of the display panel, better improves the display quality of the display panel.

To be specific, the source layer 13 is connected with a driving electrode and the drain layer 14 is connected with a pixel electrode. The metal layer comprises the source layer 13 and the drain layer 14. The thermal reactive photoresist material 3 is exposed and developed by the mask process and the heating reaction process acted on the thermal reactive photoresist material 3. The heating reaction further reduces the widths of the wire segments of the driving electrode and the pixel electrode, therefore required patterns of the driving electrode and the pixel electrode are obtained. And then the driving electrode and the pixel electrode are etched by the etching solution, therefore, the driving electrode and the pixel electrode are obtained conveniently and simply. And then, other processes are performed on the driving electrode and the pixel electrode to form the array substrate. The heating reaction of the thermal reactive photoresist material 3 reduces the widths of the wire segment of the driving electrode and the pixel electrode, which better saves space of the display panel, further improves the utilization of the panel space, and makes more pixel units to be set within per unit area. It's certainly that the thermal reactive photoresist material 3 and the ordinary photoresist material 4 can be mixed to use. The thermal reactive photoresist material 3 is disposed at a position of the wire segments of the driving electrode and the pixel electrode, and the ordinary photoresist material 4 is disposed at a position of the non-wire segment, which effectively saves the thermal reactive photoresist material 3, effectively saves production costs of the display panel, effectively improves the market competitiveness of the display panel, improves the display effect of the display panel, and further, improves the resolution of the display panel.

In another embodiment, the present disclosure provides a display device. The display device comprises a drive circuit and a display panel. The display panel comprises a color filter (CF) substrate and an array substrate disposed parallelly to the color filter substrate. The array substrate is manufactured by the above method. For a specific manufacturing method of the array substrate, reference may be made to FIG. 1 to FIG. 9, which will not be described in detail herein.

In the above embodiments, material of the substrate is selected from glass, plastic, and etc.

In the above embodiment, the display panel is selected from a liquid crystal (LC) panel, a plasma panel, and etc. Taking the LC panel as an example, the LC panel comprises the array substrate and the color filter (CF) substrate. The array substrate is disposed opposite to the CF substrate. A liquid crystal and a photo spacer (PS) are disposed between the array substrate and the CF substrate, and a thin film transistor (TFT) is disposed on the array substrate. A color filter layer is disposed on the CF substrate.

In the above embodiment, the CF substrate comprises a TFT array. The color film and the TFT array are formed on a same substrate, and the array substrate comprises the color filter layer.

In the above embodiment, the display panel of the present disclosure is a curved surface panel, and changes in color resist are not limited to the LCD.

The above content is a further detailed description of the present disclosure in conjunction with the specific preferred embodiments, and the specific implementation of the present disclosure is not limited to the description. It will be apparent to those skilled in the art that a number of simple deductions or substitutions may be made without departing from the conception of the present disclosure, which should be considered as being within the scope of the present disclosure.

What is claimed is:

1. A method for manufacturing an array substrate, comprising:
   providing a substrate;
   disposing a metal layer material on the substrate;
   disposing thermal reactive photoresist material on the metal layer material;
   obtaining a thermal reactive photoresist layer using a mask process and a thermal reaction process; and
   obtaining a metal layer by an etching process;
   wherein disposing thermal reactive photoresist material on the metal layer material comprises:
   disposing the thermal reactive photoresist material at a position of the wire segments of the metal layer; and
   disposing a ordinary photoresist material different with the thermal photoresist at a position of non-wire segments of the metal layer.

2. The method for manufacturing the array substrate according to claim 1, wherein the step for obtaining the thermal reactive photoresist layer using the mask process and the thermal reaction process comprises:
   obtaining a pattern of the metal layer on the thermal reactive photoresist material using the mask process and a heating reaction process; and
   obtaining the thermal reactive photoresist layer by a developing process.

3. The method for manufacturing the array substrate according to claim 2, wherein the step for obtaining the pattern of the metal layer on the thermal reactive photoresist material using the mask process and the heating reaction process comprise:
   obtaining a preliminary pattern of the metal layer on the thermal reactive photoresist material using the mask process; and
   obtaining the pattern of the metal layer on a basis of the preliminary pattern by the heating reaction process.

4. The method for manufacturing the allay substrate according to claim 3, wherein the step for obtaining the patterer of the metal layer on a basis of the preliminary pattern by the heating reaction process comprises:
   obtaining predetermined reaction data of the thermal reactive photoresist material according to a gap requirement of the metal layer of the may substrate; and
   obtaining the pattern of the metal layer by acting on the thermal reactive photoresist material according to the predetermined reaction data.

5. The method for manufacturing the array substrate according to claim 4, wherein the predetermined reaction data comprises a predetermined temperature.

6. The method for manufacturing the allay substrate according to claim 4, wherein the predetermined reaction data comprises a predetermined time.

7. The method for manufacturing the allay substrate according to claim 1, wherein an active switch is disposed on the substrate, and the metal layer is disposed on the active switch.

8. The method for manufacturing the array substrate according to claim 7, wherein the metal layer comprises a grid, layer of the active switch; a wire segment of the grid layer is smaller than a grating line of the mask in width.

9. The method for manufacturing the array substrate according to claim 7, wherein the metal layer comprises a source layer of the active switch and a drain layer of the active switch; a wire segment of the source layer and a wire segment of the drain layer are smaller than a grating line of the mask in width.

10. The method for manufacturing the array substrate according to claim 9, wherein the source layer is connected with a driving electrode; the drain layer is connected with a pixel electrode; the metal layer comprises the driving electrode and the pixel electrode.

11. The method for manufacturing the array substrate according to claim 10, wherein a wire segment of the driving electrode and a wire segment of the pixel electrode are smaller than the grating line of the mask in width.

12. The method for manufacturing the array substrate according to claim 1, wherein a wire segment of the metal layer is smaller a grating line of the mask in width.

13. The method for manufacturing the array substrate according to claim 1, wherein the step for obtaining a metal layer by an etching process comprises:
   removing residual thermal reactive photoresist layer.

14. A method for manufacturing an array substrate, comprising:
   providing a substrate;
   disposing a metal layer material on the substrate;
   disposing a thermal reactive photoresist material on the metal layer material;
   obtaining a preliminary pattern of a metal layer on the thermal reactive photoresist material using a mask process;

obtaining predetermined reaction data of the thermal reactive photoresist material according to a gap requirement of the metal layer of the array substrate;

obtaining the pattern of the metal layer by acting on the thermal reactive photoresist material according to the predetermined reaction data: the predetermined reaction data comprises a predetermined temperature and a predetermined time;

obtaining a thermal reactive photoresist layer by a developing process:

obtaining the metal layer by an etching process; and removing residual thermal reactive photoresist layer;

wherein disposing thermal reactive photoresist material on the metal layer material comprises:

disposing the thermal reactive photoresist material at a position of the wire segments of the metal laver; and disposing a ordinary photoresist material different with the thermal photoresist at a position of non-wire segments of the metal layer.

15. A display device, comprising:

a drive circuit; and a display panel;

wherein the display panel comprises a method for manufacturing an array substrate, the method for manufacturing an array substrate, comprising:

providing a substrate;

disposing a metal layer material on the substrate;

disposing thermal reactive photoresist material on the metal layer material;

obtaining a thermal reactive photoresist layer using a mask process and a thermal reaction process: and obtaining a metal layer by an etching process;

wherein disposing thermal reactive photoresist material on the metal layer material comprises:

disposing the thermal reactive photoresist material at a position of the wire segments of the metal layer; and disposing a ordinary photoresist material different with the thermal photoresist at a position of non-wire segments of the metal layer.

* * * * *